(12) United States Patent  
Miyamoto et al.

(10) Patent No.: US 9,951,972 B2  
(45) Date of Patent: Apr. 24, 2018

(54) FIXING METAL BRACKET AND SOLAR BATTERY SYSTEM

(71) Applicant: MITSUBISHI ELECTRIC CORPORATION, Chiyoda-ku, Tokyo (JP)

(72) Inventors: Shinsuke Miyamoto, Tokyo (JP); Shinji Nakazono, Tokyo (JP); Daisuke Nakamura, Tokyo (JP); Issei Suzuki, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/529,903

(22) PCT Filed: Nov. 28, 2014

(86) PCT No.: PCT/JP2014/081611  
§ 371 (c)(1),  
(2) Date: May 25, 2017

(87) PCT Pub. No.: WO2016/084242  
PCT Pub. Date: Jun. 2, 2016

(65) Prior Publication Data  
US 2017/0328602 A1 Nov. 16, 2017

(51) Int. Cl.  
*F24J 2/52* (2006.01)  
*H02S 20/23* (2014.01)  
(Continued)

(52) U.S. Cl.  
CPC .......... *F24J 2/5211* (2013.01); *F24J 2/5201* (2013.01); *F24J 2/526* (2013.01); *F24J 2/5207* (2013.01);  
(Continued)

(58) Field of Classification Search  
CPC .......... H02S 20/23; H02S 30/10; Y02B 10/12  
See application file for complete search history.

(56) References Cited

U.S. PATENT DOCUMENTS 5,460,660 A * 10/1995 Albright ................ H02S 30/10  
136/251  
7,297,866 B2 * 11/2007 Aschenbrenner ...... F24J 2/5211  
136/243  
(Continued)

FOREIGN PATENT DOCUMENTS

JP 2000-087522 A 3/2000  
JP 2003-343058 A 12/2003  
(Continued)

OTHER PUBLICATIONS

International Search Report (PCT/ISA/210) dated Jan. 6, 2015, by the Japanese Patent Office as the International Searching Authority for International Application No. PCT/JP2014/081611.  
(Continued)

*Primary Examiner* — Rodney Mintz  
(74) *Attorney, Agent, or Firm* — Buchanan Ingersoll & Rooney PC

(57) ABSTRACT

A holding frame holds a polygonal solar battery panel including a light receiving surface. The frame includes a lower disposed in a spaced relationship with a back surface opposite to the light receiving surface, a rising part extending upward from the lower part, and a holding part formed at an end portion of the rising part on a side of the panel to hold one side of the panel. The holding part includes a portion protruding inwardly from the end portion, a portion protruding outwardly from the end portion, a portion extending upwardly from an outside of the outward-protruding portion, and a sandwiching portion extending inwardly from the upward extending portion to sandwich the panel between the sandwiching portion and the outward-protruding portion.

(Continued)

The lower part includes a portion protruding inwardly relative to the rising part, and an outward-protruding portion protruding outwardly relative to the rising part.

3 Claims, 5 Drawing Sheets

(51) Int. Cl.
 *H02S 30/10* (2014.01)
 *E04D 13/18* (2014.01)
 *H01L 31/048* (2014.01)

(52) U.S. Cl.
 CPC .......... *F24J 2/5252* (2013.01); *H01L 31/048* (2013.01); *H02S 30/10* (2014.12)

(56) References Cited

U.S. PATENT DOCUMENTS

| | | | | |
|---|---|---|---|---|
| 7,694,466 | B2 * | 4/2010 | Miyamoto | F24J 2/5207 |
| | | | | 126/623 |
| 7,774,998 | B2 * | 8/2010 | Aschenbrenner | F24J 2/5211 |
| | | | | 136/244 |
| 8,511,008 | B2 * | 8/2013 | Sagayama | F24J 2/5207 |
| | | | | 136/244 |
| 9,171,980 | B2 * | 10/2015 | Chiu | H02S 20/22 |
| 2005/0199278 | A1 * | 9/2005 | Aschenbrenner | F24J 2/5211 |
| | | | | 136/251 |
| 2008/0110493 | A1 * | 5/2008 | Aschenbrenner | F24J 2/5211 |
| | | | | 136/251 |
| 2008/0169018 | A1 | 7/2008 | Miyamoto et al. | |
| 2010/0282290 | A1 * | 11/2010 | Schwarze | F24J 2/5205 |
| | | | | 136/244 |
| 2011/0146763 | A1 | 6/2011 | Sagayama | |
| 2012/0298817 | A1 * | 11/2012 | West | F24J 2/5211 |
| | | | | 248/220.22 |
| 2014/0182678 | A1 * | 7/2014 | Chiu | H02S 20/22 |
| | | | | 136/259 |
| 2016/0226434 | A1 * | 8/2016 | Tomlinson | H02S 20/23 |

FOREIGN PATENT DOCUMENTS

| | | |
|---|---|---|
| JP | 4381634 B2 | 12/2009 |
| JP | 2013-170351 A | 9/2013 |
| JP | 2014-084583 A | 5/2014 |
| WO | WO 2006/016412 A1 | 2/2006 |
| WO | WO 2010/024154 A1 | 3/2010 |
| WO | WO 2012043656 A1 * | 4/2012 ............ F24J 2/5205 |

OTHER PUBLICATIONS

Written Opinion (PCT/ISA/237) dated Jan. 6, 2015, by the Japanese Patent Office as the International Searching Authority for International Application No. PCT/JP2014/081611.

\* cited by examiner

FIXING METAL BRACKET AND SOLAR BATTERY SYSTEM

FIELD

The present invention relates to a holding frame to hold a solar battery panel, and a solar battery module and solar battery system using the same.

BACKGROUND

In general, a solar battery module includes a solar battery panel and holding frames that hold the solar battery panel. The solar battery panel is configured such that solar battery cells connected to each other in series or in parallel are sealed by a resin and a transparent plate on the light receiving surface side. The holding frames are disposed around the solar battery panel, and hold the outer peripheral edge portions of the solar battery panel. The holding frames not only hold the solar battery panel, but also serve as a fixing member for installing the solar battery panel. Patent Literature 1 discloses a solar battery module in which a solar battery panel is held by holding frames.

CITATION LIST

Patent Literature

Patent Literature 1: Japanese Patent Application Laid-open No. 2003-343058

SUMMARY

Technical Problem

A holding frame for a solar battery module is required to have a strength sufficient to withstand its own weight and an external force exerted by wind and snow. As disclosed in Patent Literature 1, to improve the strength of the holding frame by providing its sectional shape with a tubular shape extending in parallel with a side of the solar battery panel, there is need to form a hole to discharge water having intruded into the tubular shape portion, which can lead to the increase in the manufacturing cost.

The present invention has been made in view of the above, and an object of the present invention is to provide a holding frame that can reduces the manufacturing cost and improve the strength.

Solution to Problem

To solve the above-mentioned problem and achieve the object, the present invention provides a holding frame to hold a solar battery panel including a light receiving surface and having a polygonal shape, the holding frame comprising: a lower side part disposed on a side of a back surface opposite to the light receiving surface, the lower side part being spaced from the back surface and facing an outer peripheral edge portion of the back surface extending along one side of the solar battery panel; a rising side part extending from the lower side part toward the outer peripheral edge portion; and a holding part to hold the one side of the solar battery panel, the holding part being formed at an end portion of the rising side part on a side of the solar battery panel, wherein the holding part includes an inward-protruding upper side portion protruding from the end portion of the rising side part in an inward direction, an outward-protruding upper side portion protruding from the end portion of the rising side part in an outward direction, an upward extending portion extending from an outside of the outward-protruding upper side portion in an upward direction, and a sandwiching portion to sandwich the solar battery panel between the sandwiching portion and the outward-protruding upper side portion, the sandwiching portion extending from the upward extending portion in the inward direction, the upward direction being a direction from the lower side part toward the solar battery panel, the outward direction being a direction from the outer peripheral edge portion of the back surface toward the one side of the solar battery panel, and the inward direction being a direction opposite to the outward direction, and the lower side part includes an inward-protruding lower side portion protruding in the inward direction relative to the rising side part, and an outward-protruding lower side portion protruding in the outward direction relative to the rising side part.

Advantageous Effects of Invention

The holding frame according to the present invention achieves an effect of reducing the manufacturing cost and improving the strength.

DESCRIPTION OF EMBODIMENT

An exemplary embodiment of a holding frame, a solar battery module, and a solar battery system according to the present invention will be explained below in detail with reference to the accompanying drawings. The present invention is not limited to the following embodiment.

First Embodiment

Figure 1:
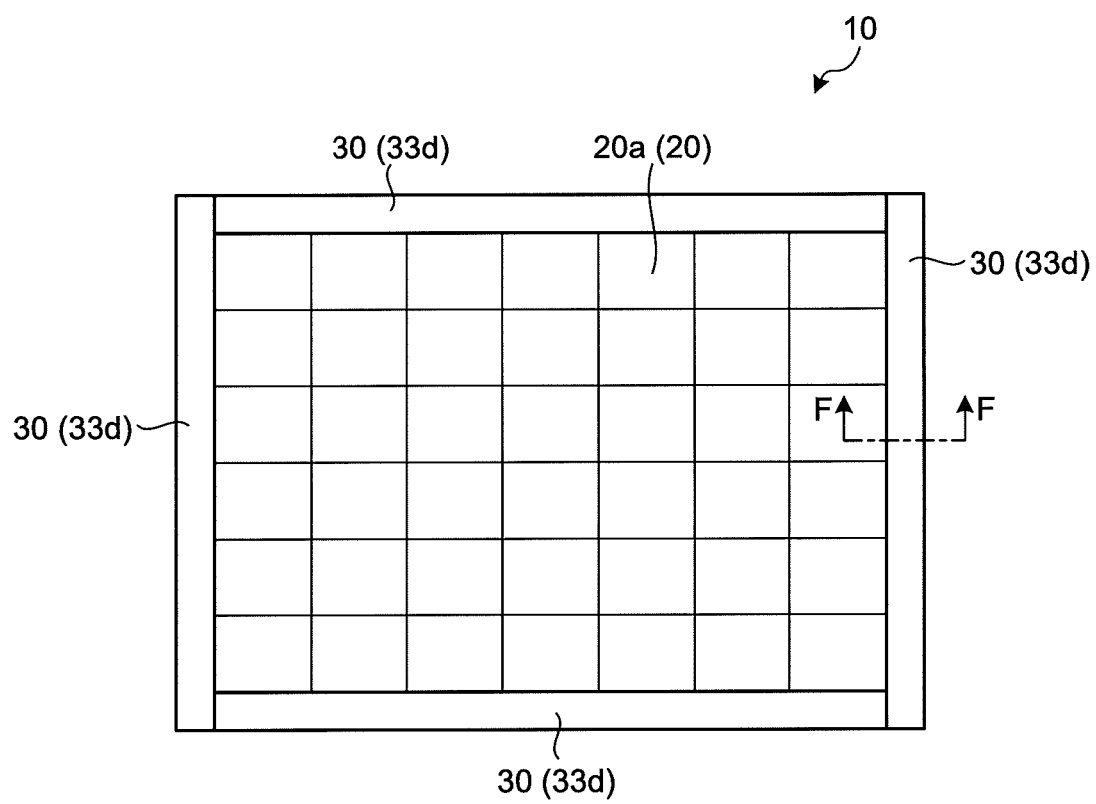
FIG. 1 is a sectional view illustrating a solar battery module according to a first embodiment of the present invention.

FIG. 1 is a sectional view illustrating a solar battery module according to a first embodiment of the present invention. The solar battery module 10 includes a solar battery panel 20 to generate electricity by light incident on a light receiving surface 20a, and holding frames 30 disposed around the solar battery panel 20 and holding the solar battery panel 20.

Figure 2:
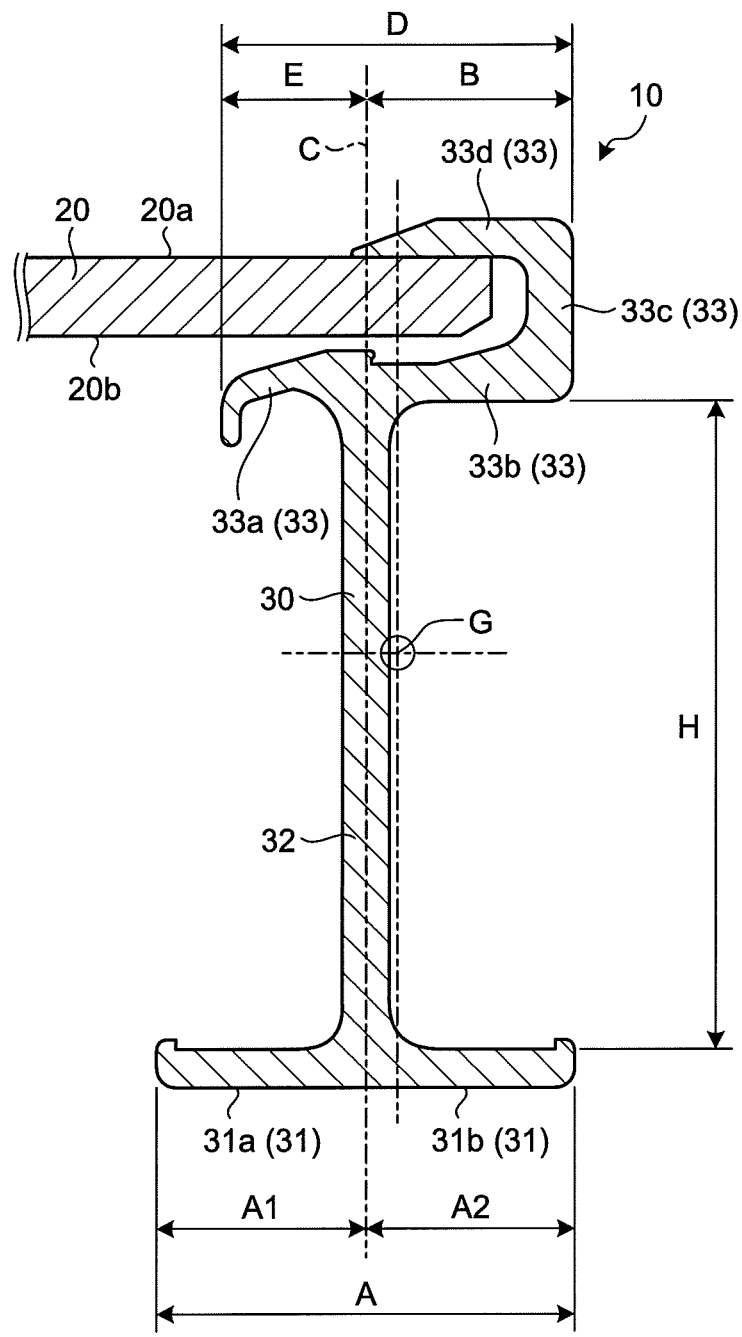
FIG. 2 is a sectional view of the solar battery module according to the first embodiment, which is taken along line F-F indicated in FIG. 1.

The solar battery panel 20 has a plate-shape that provides a polygonal shape when viewed from the side of the light receiving face 20a. The holding frames 30 are disposed along the respective sides of the solar battery panel 20 having a polygonal shape. As illustrated in FIG. 1, one holding frame 30 is disposed with respect to one side of the solar battery panel 20. FIG. 2 is a sectional view of the solar battery module 10 according to the first embodiment, which is taken along line F-F indicated in FIG. 1, and illustrates a sectional view of the holding frame 30 disposed along one side of the solar battery panel 20.

The holding frame 30 includes a lower side part 31 disposed on a side of a back surface 20b opposite to the light receiving surface 20a of the solar battery panel 20, the lower side part 31 being spaced from the back surface 20b. The back surface 20b has an outer peripheral edge portion extending along the one side of the solar battery panel 20, and the lower side part 31 faces this outer peripheral edge portion. A direction from the lower side part 31 toward the solar battery panel 20 is defined as an upward direction. In FIG. 2, also, a direction from the outer peripheral edge portion of the back surface 20b toward the one side of the solar battery panel 20 is defined as an outward direction, and a direction opposite to the outward direction is defined as an inward direction.

The holding frame 30 includes a rising side part 32 extending from the lower side part 31 toward the outer peripheral edge portion of the back surface 20b of the solar battery panel 20. In other words, the lower side part 31 is defined as including, relative to the rising side part 32, an inward-protruding lower side portion 31a protruding from the rising side part 32 in the inward direction and an outward-protruding lower side portion 31b protruding from the rising lower side 32 in the outward direction.

The rising side part 32 has an end portion on a side of the solar battery panel 20. At the end portion of the rising side part 32, there is formed a holding part 33 to hold the one side of the solar battery panel 20. The end portion of the rising side part 32 at which the holding part 33 is formed is referred to as "upper end". The holding part 33 includes an inward-protruding upper side portion 33a, an outward-protruding upper side portion 33b, an upward extending portion 33c, and a sandwiching portion 33d. The inward-protruding upper side portion 33a protrudes from the upper end of the rising side part 32 in the inward direction. The outward-protruding upper side portion 33b protrudes from the upper end in the outward direction. The upward extending portion 33c extends from the outside of the outward-protruding upper side portion 33b in the upward direction. The sandwiching portion 33d extends from the upward extending portion 33c in the inward direction to sandwich the solar battery panel 20 between the sandwiching portion 33d and the outward-protruding upper side portion 33b.

The holding frame 30 has an I-shape as a whole in cross section that is defined by the lower side part 31, the rising side part 32, and the holding part 33. Further, as illustrated in FIG. 1, when viewed along the one side of the solar battery panel 20 held by the holding frame 30, the rising side part 32 is located inside the center of gravity G of the holding frame 30. The center of gravity G of the holding frame 30 as used herein is not the center of gravity of the entirety of the holding frames 30 that surround the solar battery panel 20, but the center of gravity of one holding frame 30 that holds the one side of the solar battery panel 20.

Further, when viewed along the one side of the solar battery panel 20 held by the holding frame 30, a protrusion length A1 by which the inward-protruding lower side portion 31a protrudes from the vertically extending center line C of the rising side part 32 is equal to a protrusion length A2 by which the outward-protruding lower side portion 31b protrudes from the center line C. Further, an outward protrusion length B by which the holding part 33 protrudes outwardly from the center line C is desirably equal to a protrusion length A2 by which the outward-protruding lower side portion 31b protrudes from the center line C.

Further, a relationship between a height H of the rising side part 32 and a width A of the lower side part 31 desirably satisfies the formula expressed by A<H<2 A. Further, when viewed along the one side of the solar battery panel 20 held by the holding frame 30, a relationship between a width D of the entirety of the inward-protruding extending upper side portion 33a and the outward-protruding extending upper side portion 33b and an inward protrusion length E by which the inward-protruding upper side portion 33a protrudes from the center line C preferably satisfies the formula expressed by D/4<E<D/2.

According to the solar battery module 10 described above, the I-shaped cross-section of the holding frame 30 improves the bending rigidity or bending strength per weight, namely, improves the efficiency in cross section. This makes it possible to reduce the material of the holding frame 30 and thus the manufacturing cost as well as to improve the strength. Further, the absence of a tubular portion eliminates the need to form a hole for discharging water. Thus, it is possible to suppress the manufacturing cost.

Further, when the outward extending lower side portion 31b is used for securing the solar battery module 10, the holding part 33 hardly hinders the securing work as the outward protrusion length B of the holding part 33 is equal to the protrusion length A2 of the outward-protruding lower side portion 31b. Furthermore, when solar battery modules 10 are arranged side by side, the solar battery module 10 can be set closer to each other. Consequently, it is possible to increase the ratio of the light receiving face 20a of the solar battery panel 20 to the installation area of the solar battery modules 10, and thus improve the power generation efficiency per installation area.

Additionally, when the relationship between the height H of the rising side part 32 and the width A of the lower side part 31 satisfies the formula expressed by A<H<2 A, the holding frame 30 achieves its higher efficiency in cross section As regards the formula expressed by D/4<E<D/2 that indicates the relationship between the width D of the entirety of the inward-protruding upper side portion 33a and the outward-protruding upper side portion 33b and the inward protrusion length E of the inward-protruding upper side portion 33a from the center line C, the part "E<D/2" means that the rising side part 32 is disposed inside the center of the width D. This enables the rising side part 32 to be disposed inside the center of gravity G. Further, the part "D/4<E" can improve the efficiency in cross section of the holding frame 30.

For the holding frame 30 itself, the rising side part 32 is desirably located on the center of gravity G. It is however desired that the rising side part 32 be disposed inside the center of gravity G, as illustrated in the first embodiment, taking into consideration the load of the held solar battery panel 20 and an external force exerted by wind and snow on the light receiving surface 20a.

Figure 3:
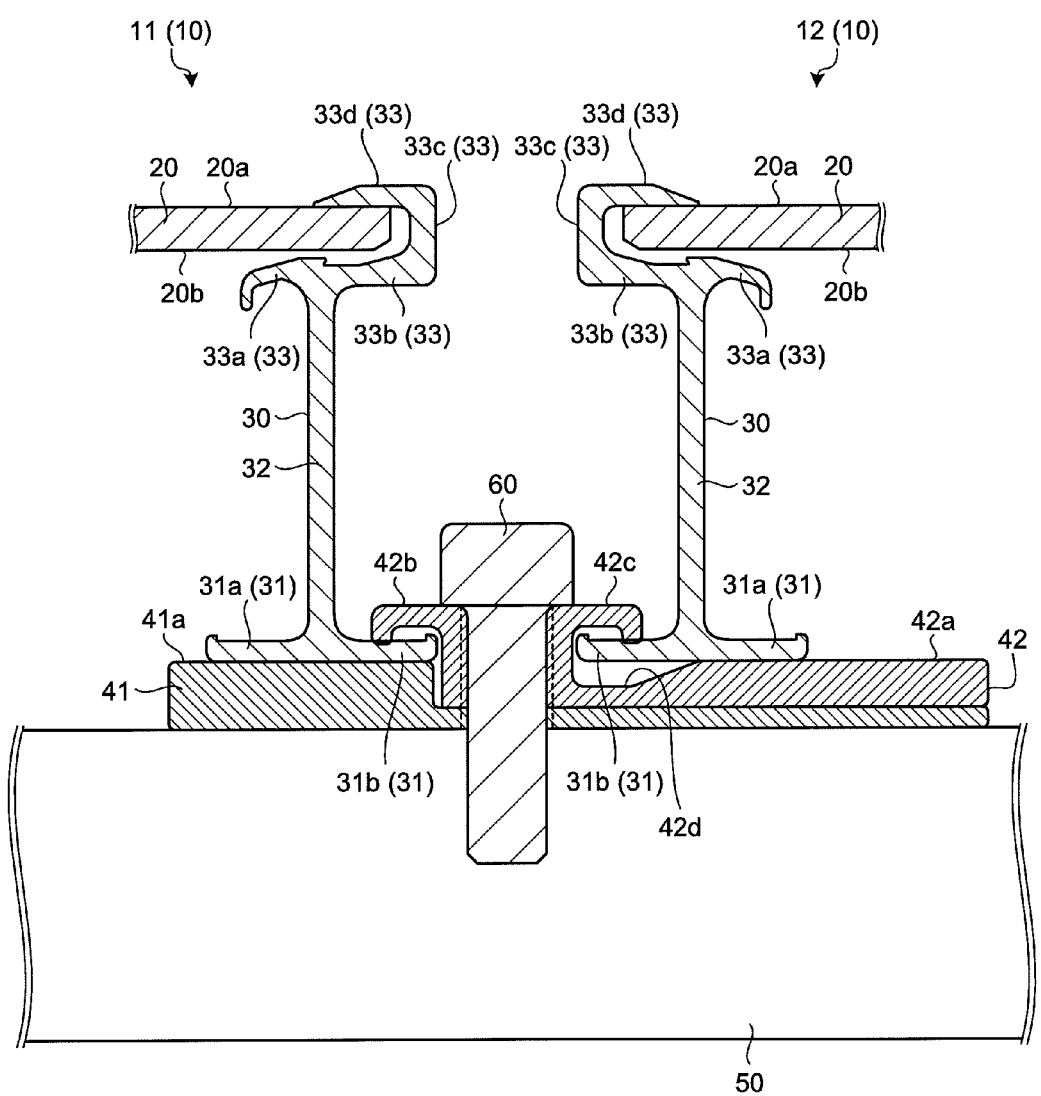
FIG. 3 is a partial sectional view illustrating part of a solar battery system using the solar battery modules according to the first embodiment.

Next, a description is made as to a solar battery system configured to have a plurality of solar battery modules 10 arranged side by side. FIG. 3 is a partial sectional view illustrating part of a solar battery system using the solar battery modules 10 according to the first embodiment. FIG. 3 illustrates an enlarged location where the solar battery modules 10 arranged side by side are fixed by fixing metal brackets 41 and 42. It is noted that one of the solar battery modules 10 arranged side by side is referred to as "solar battery module 11", and the other is referred to as "solar battery module 12".

The solar battery modules 11 and 12 are secured to a mount 50 installed on a roof or ground. It is noted that the place where the mount 50 is disposed is not limited to a roof or ground. The solar battery module 11 is carried on a lower side support surface 41a of the fixing metal bracket 41 disposed on the mount 50.

The solar battery module 12 is carried on a lower side support surface 42a that is a lower side support part of the fixing metal bracket 42 disposed on the mount 50. At the fixing metal bracket 42, there are formed a first pressing portion 42b to press the outward-protruding lower side portion 31b of the solar battery module 11 from above, and a second pressing portion 42c to press the outward-protruding lower side portion 31b of the solar battery module 12 from above. The fixing metal brackets 41 and 42 are secured to the mount 50 by a bolt 60, thereby securing the solar battery modules 11 and 12 to the mount 50.

The lower side support surface 42a of the fixing metal bracket 42 includes a recessed portion 42d formed at a portion thereof facing the outward-protruding lower side portion 31b of the solar battery module 12. Since the recessed portion 42d is formed, a gap is formed between the outward-protruding lower side portion 31b of the solar battery module 12 and the lower side support surface 42a of the fixing metal bracket 42.

Figure 4:
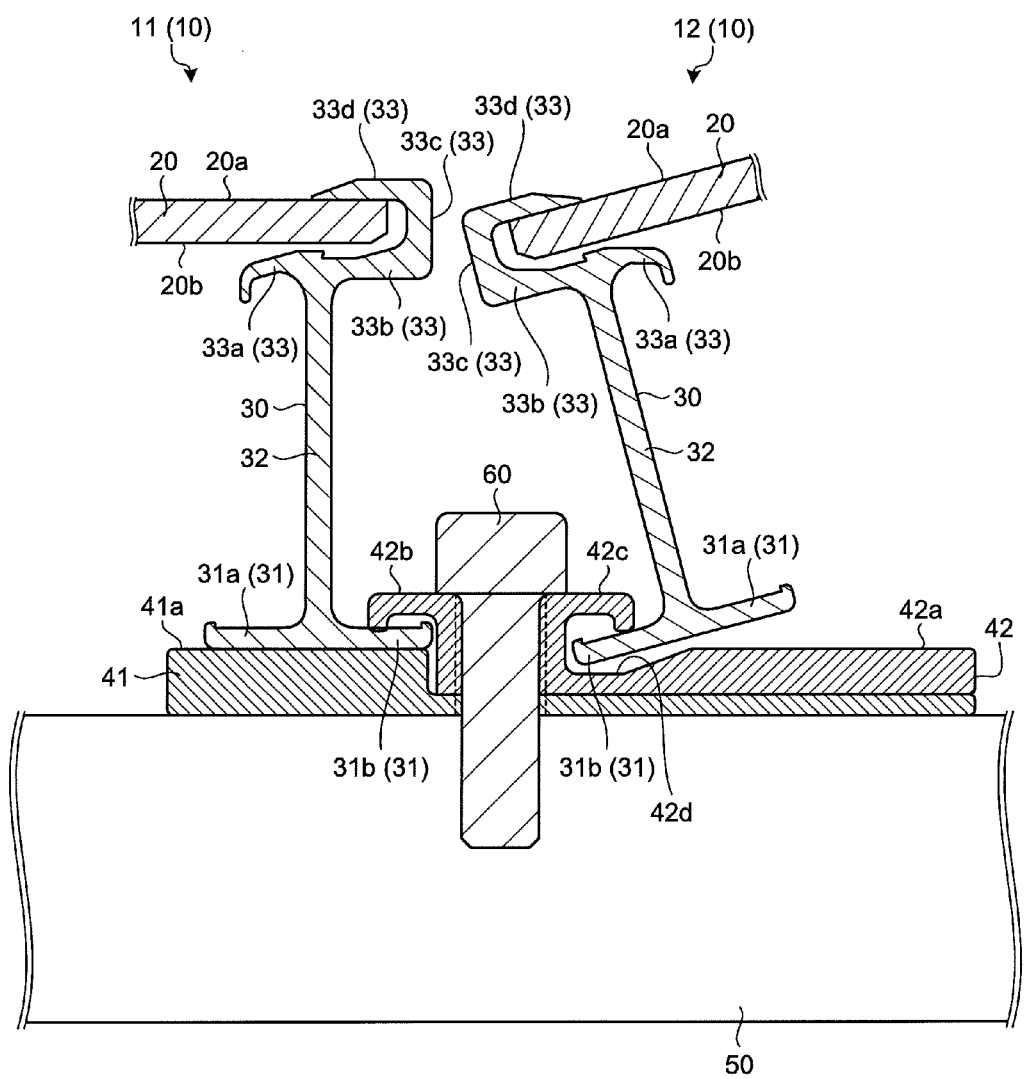
FIG. 4 is a partial sectional view illustrating steps of installing the solar battery system using the solar battery modules according to the first embodiment.

Next, a description is made as to steps of installing the solar battery modules 11 and 12 in the solar battery system discussed above. FIG. 4 is a partial sectional view illustrating steps of installing the solar battery system using the solar battery modules 11 and 12 according to the first embodiment.

First, the fixing metal fitting 41 is installed on the mount 50, and the solar battery module 11 is carried on the lower side support surface 41a of the fixing metal fitting 41. Next, the bolt 60 is fastened to the trestle 50, with the first pressing portion 42b of the fixing metal bracket 42 pressing the outward-protruding lower side portion 31b of the solar battery module 11. These steps secure the solar battery module 11.

Then, as illustrated in FIG. 4, the outward-protruding lower side portion 31b of the solar battery module 12 is inserted into the recessed portion 42d formed on the lower side support surface 42a of the fixing metal bracket 42, after which the lower side part 31 of the solar battery module 12 is carried on the lower side support surface 42a. This results in the state illustrated in FIG. 3.

Finally, a holding frame (not shown) disposed at a position opposed to the holding frame 30 of the solar battery module 12 illustrated in FIGS. 3 and 4 is secured as in the holding frame 30 of the solar battery module 11 illustrated in FIGS. 3 and 4, thereby securing the solar battery module 12 to the mount 50.

As is clear from the foregoing, the fixing metal bracket 42 is secured by the bolt 60 when the solar battery module 12 is not yet carried, rather than after the solar battery modules 11 and 12 are arranged side by side in advance. In doing such securing work, thus, the working space is readily available to thereby improve the workability.

Further, using the lower sides 31 to secure the solar battery modules 11 and 12 reduces the material used and thus the manufacturing cost, as compared with a holding frame including a flange formed thereon to secure the solar battery modules 11 and 12.

Figure 5:
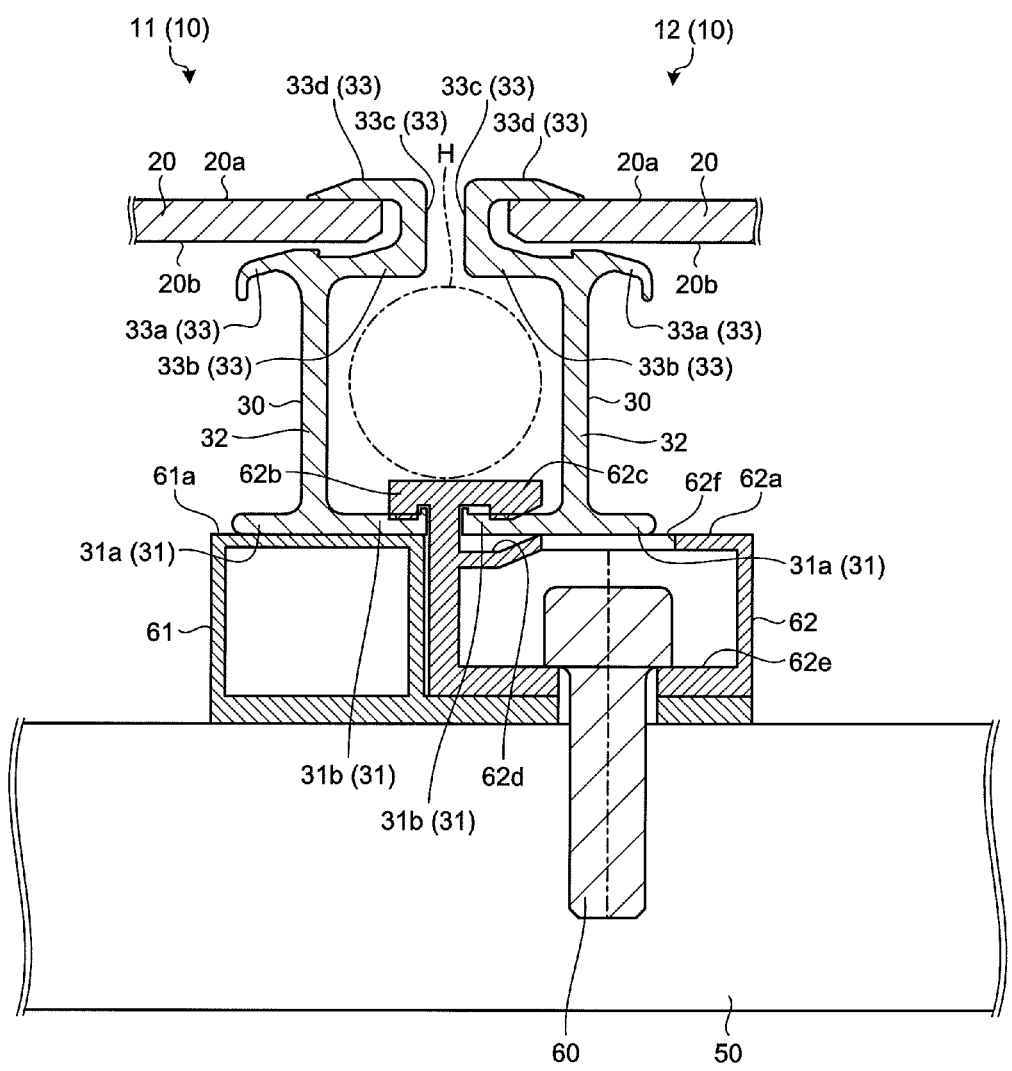
FIG. 5 is a partial sectional view illustrating another example of a solar battery system using the solar battery modules according to the first embodiment.

Next, a description is made as to another example of a solar battery system using the solar battery modules 11 and 12. FIG. 5 is a partial sectional view illustrating another example of a solar battery system using the solar battery modules 11 and 12 according to the first embodiment. As compared with the solar battery system illustrated in FIG. 3, the solar battery system illustrated in FIG. 5 shortens the distance between the solar battery modules 11 and 12 to thereby increase the ratio of the light receiving surface 20a of the solar battery panel 20 to the installation area of the solar battery system.

The solar battery module 11 is carried on a lower side support surface 61a of a fixing metal bracket 61. The solar battery module 12 is carried on a lower side support surface 62a that is a lower side support part of a fixing metal bracket 62. At the fixing metal bracket 62, there are formed a first pressing portion 62b to press the outward-protruding lower side portion 31b of the solar battery module 11 from above, and a second pressing portion 62c to press the outward-protruding lower side portion 31b of the solar battery module 12 from above. The lower side support surface 62a of the fixing metal bracket 62 includes a recessed portion 62d formed at a portion thereof facing the outward-protruding lower side portion 31b of the solar battery module 12.

The lower side support surfaces 61a and 62a of the fixing metal brackets 61, 62 are more distant from the mount 50 than the example illustrated in FIGS. 3 and 4. Further, a head accommodation space 62e to accommodate the head of the bolt 60 is formed between the lower side support surface 62a of the fixing metal bracket 62 and the mount 50. A through hole 62f to allow the bolt 60 to pass therethrough is formed through the lower side support surface 62a of the fixing metal bracket 62.

The bolt 60, which is fastened through the through hole 62f to the mount 50, secures the solar battery modules 11 and 12 to the mount 50. The head of the bolt 60 fastened to the trestle 50 is accommodated in the head accommodation space 62e, and thus is not exposed on the lower side support surface 62a. This enables the holding frame 30 of the solar battery module 12 to be carried on the lower side support surface 62a after the fastening of the bolt 60.

Further, as illustrated in FIG. 5, there is no need to dispose the bolt 60 between the first pressing portion 62b and the second pressing portion 62c. In other words, there is no need to dispose the bolt 60 in a space H. Accordingly, as compared with the example illustrated in FIGS. 3 and 4, the distance between the solar battery module 11 and the solar battery module 12 can be set small. This makes it possible to increase the ratio of the light receiving surface 20a of the solar battery panel 20 to the installation area of the solar battery system to thereby improve the power generation efficiency per installation area.

The configurations illustrated in the above embodiment are mere examples of the contents of the present invention, and they may be combined with other known techniques. Further, the configurations may be partly omitted or changed without departing from the spirit of the present invention.

REFERENCE SIGNS LIST 10, 11, 12 solar battery module, 20 solar battery panel, 20a light receiving surface, 20b back surface, 30 holding frame, 31 lower side part, 31a inward-protruding lower side portion, 31b outward-protruding lower side portion, 32 rising side part, 33 holding part, 33a inward-protruding upper side portion, 33b outward-protruding upper side portion, 33c upward extending portion, 33*d* sandwiching portion, 42 fixing metal bracket, 42*a* lower side support surface (lower side support part), 42*b* first pressing portion, 42*c* second pressing portion, 42*d* recessed portion, 62 fixing metal bracket, 62*a* lower side support surface (lower side support part), 62*b* first pressing portion, 62*c* second pressing portion, 62*d* recessed portion, 62*e* head accommodation space.

The invention claimed is:

1. A system comprising:
a fixing metal bracket configured to secure a plurality of solar battery modules with respective holding frames of the modules facing each other, the solar battery modules each including the respective holding frame and a polygonal solar battery panel held by said holding frame and having a light receiving surface, the holding frame comprising:
   a lower side part disposed on a side of a back surface opposite to the light receiving surface, the lower side part being spaced from the back surface and facing an outer peripheral edge portion of the back surface extending along one side of the solar battery panel; and
   a rising side part extending from the lower side part toward the outer peripheral edge portion,
   a direction from the outer peripheral edge portion of the back surface toward the one side of the solar battery panel being an outward direction, and a direction opposite to the outward direction being an inward direction, and
   the lower side part including an inward-protruding lower side portion protruding in the inward direction relative to the rising side part, and an outward-protruding lower side portion protruding in the outward direction relative to the rising side part, wherein
the fixing metal bracket comprises:
   a first pressing portion pressing, from above, the outward-protruding lower side portion of one of the holding frames facing each other;
   a second pressing portion pressing, from above, the outward-protruding lower side portion of the other of the holding frames facing each other; and
   a lower side support part supporting, from below, the lower side part of the other of the holding frames,
   wherein the lower side support part has a recessed portion formed at a portion thereof facing the second pressing portion, and the outward-protruding lower side portion of the other of the holding frames and the lower side support part form a gap therebetween.

2. A solar battery system comprising:
a plurality of the solar battery modules each including a holding frame and a polygonal solar battery panel held by the holding frame and having a light receiving surface; and
a fixing metal bracket securing the solar battery modules with the respective holding frames of the modules facing each other,
wherein the holding frame includes:
   a lower side part disposed on a side of a back surface opposite to the light receiving surface, the lower side part being spaced from the back surface and facing an outer peripheral edge portion of the back surface extending along one side of the solar battery panel; and
   a rising side part extending from the lower side part toward the outer peripheral edge portion,
   wherein a direction from the outer peripheral edge portion of the back surface toward the one side of the solar battery panel is an outward direction, and a direction opposite to the outward direction is an inward direction, and
   the lower side part includes an inward-protruding lower side portion protruding in the inward direction relative to the rising side part, and an outward-protruding lower side portion protruding in the outward direction relative to the rising side part,
wherein the fixing metal bracket includes:
   a first pressing portion pressing, from above, the outward-protruding lower side portion of one of the holding frames facing each other;
   a second pressing portion pressing, from above, the outward-protruding lower side portion of the other of the holding frames facing each other; and
   a lower side support part supporting, from below, the lower side part of the other of the holding frames,
   wherein the lower side support part has a recessed portion formed at a portion thereof facing the second pressing portion, and the outward-protruding lower side portion of the other of the holding frames and the lower side support part form a gap therebetween.

3. The solar battery system according to claim 2, wherein the fixing metal bracket has a head accommodation space to accommodate a head of a bolt securing the fixing metal bracket, the head accommodation space being formed in a lower portion of the fixing metal bracket.

* * * * *